United States Patent
Unger et al.

(10) Patent No.: US 10,178,790 B2
(45) Date of Patent: Jan. 8, 2019

(54) TERMINAL BLOCK FOR AN ELECTRONIC DEVICE

(71) Applicant: Phoenix Contact GmbH & Co. KG, Blomberg (DE)

(72) Inventors: Eduard Unger, Bielefeld (DE); Frank Best, Bueckeburg (DE); Joerg Soefker, Lemgo (DE); Detlev Falk, Blomberg (DE); Christian Funke, Detmold (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/308,644

(22) PCT Filed: Apr. 30, 2015

(86) PCT No.: PCT/EP2015/059548
§ 371 (c)(1),
(2) Date: Nov. 3, 2016

(87) PCT Pub. No.: WO2015/169691
PCT Pub. Date: Nov. 12, 2015

(65) Prior Publication Data
US 2017/0188479 A1    Jun. 29, 2017

(30) Foreign Application Priority Data

May 6, 2014    (DE) .................. 10 2014 106 277

(51) Int. Cl.
*H01R 9/18*    (2006.01)
*H01R 9/24*    (2006.01)
(Continued)

(52) U.S. Cl.
CPC ............ *H05K 7/1469* (2013.01); *H01R 9/18* (2013.01); *H01R 9/2408* (2013.01); *H01R 9/26* (2013.01); *H01R 13/506* (2013.01)

(58) Field of Classification Search
CPC .. H01R 9/2408; H01R 9/26; H01R 13/62911; H01R 13/62905; H01R 13/62927; H05K 7/1469
See application file for complete search history.

(56) References Cited

U.S. PATENT DOCUMENTS 4,032,209 A * 6/1977 Rutkowski ............... H01R 9/26
                                                            439/211
4,090,764 A * 5/1978 Malsby ................ H01R 13/514
                                                            439/471

(Continued)

FOREIGN PATENT DOCUMENTS

CN    1181158 A    5/1998
CN    1894829 A    1/2007
(Continued)

*Primary Examiner* — Edwin A. Leon
*Assistant Examiner* — Oscar Jimenez
(74) *Attorney, Agent, or Firm* — Leydig, Voit & Mayer, Ltd.

(57) ABSTRACT

A terminal block for an electronic device, which block can be attached to an electronics housing of the electronic device, includes at least one base strip comprising a plurality of connector sockets; and a plurality of connector modules that can be attached to the connector sockets of the at least one base strip in at least one insertion direction, are held on the connector sockets in an inserted position, and can be released from the connector sockets to be removed from the at least one base strip; and a locking device. The locking device includes: an actuating part that can be moved relative to the at least one base strip in an actuation direction; and a plurality of locking elements that are engaged in a locking manner in mating elements of the connector modules in a locked position.

23 Claims, 13 Drawing Sheets

(51) Int. Cl.
*H01R 9/26* (2006.01)
*H01R 13/506* (2006.01)
*H05K 7/14* (2006.01)

(56) References Cited

U.S. PATENT DOCUMENTS

| | | | | |
|---|---|---|---|---|
| 4,268,108 | A * | 5/1981 | Debaigt | H01R 9/2608 |
| | | | | 439/716 |
| 4,454,382 | A * | 6/1984 | Borne | H02B 1/052 |
| | | | | 174/158 R |
| 4,586,771 | A | 5/1986 | Kraemer et al. | |
| 4,997,386 | A * | 3/1991 | Kawachi | H01R 13/514 |
| | | | | 439/352 |
| 5,431,573 | A | 7/1995 | Endo et al. | |
| 5,564,935 | A * | 10/1996 | Yagi | H01R 13/62966 |
| | | | | 439/157 |
| 5,660,556 | A | 8/1997 | Badaroux et al. | |
| 5,876,226 | A * | 3/1999 | Tsukakoshi | H01R 13/62922 |
| | | | | 439/157 |
| 5,888,080 | A * | 3/1999 | Maejima | H01R 13/62905 |
| | | | | 439/157 |
| 5,902,141 | A | 5/1999 | Iwahori | |
| 5,957,709 | A * | 9/1999 | Heimueller | H01R 13/62927 |
| | | | | 439/157 |
| 5,964,624 | A * | 10/1999 | Pernelle | H01R 31/02 |
| | | | | 439/357 |
| 6,183,279 | B1 | 2/2001 | Murakami et al. | |
| 6,200,164 | B1 * | 3/2001 | Martin | H01R 13/62911 |
| | | | | 439/595 |
| 6,244,880 | B1 | 6/2001 | Fukase et al. | |
| 6,475,004 | B2 * | 11/2002 | Shuey | H01R 13/62911 |
| | | | | 439/157 |
| 6,997,725 | B2 * | 2/2006 | Stella | H01R 13/453 |
| | | | | 439/157 |
| 7,335,037 | B2 * | 2/2008 | Razafiarivelo | H01R 13/62911 |
| | | | | 439/157 |
| 9,011,173 | B2 * | 4/2015 | Osada | H01R 13/514 |
| | | | | 439/527 |
| 9,039,460 | B2 * | 5/2015 | Hackemack | H01R 9/16 |
| | | | | 439/716 |
| 9,356,390 | B2 * | 5/2016 | Annis | H01R 13/62911 |
| 9,368,910 | B2 * | 6/2016 | Eichorn | H01R 13/62933 |
| 9,666,984 | B2 * | 5/2017 | Wanschoor | H01R 13/62922 |
| 2002/0140534 | A1 * | 10/2002 | Konda | H01H 1/365 |
| | | | | 335/202 |
| 2002/0146931 | A1 * | 10/2002 | Richmond | H01R 13/6453 |
| | | | | 439/488 |
| 2007/0066123 | A1 * | 3/2007 | Arlitt | H01R 4/24 |
| | | | | 439/409 |
| 2008/0032550 | A1 | 2/2008 | Daudin et al. | |
| 2010/0202116 | A1 | 8/2010 | Soefker et al. | |
| 2012/0064780 | A1 * | 3/2012 | Wu | H01R 4/4836 |
| | | | | 439/712 |
| 2013/0248244 | A1 * | 9/2013 | Pizzi | H05K 5/0069 |
| | | | | 174/541 |
| 2014/0017925 | A1 * | 1/2014 | Shiga | H01R 13/62 |
| | | | | 439/347 |
| 2015/0333441 | A1 * | 11/2015 | Annis | H01R 13/62911 |
| | | | | 439/133 |
| 2016/0268748 | A1 * | 9/2016 | Best | H01R 9/2408 |

FOREIGN PATENT DOCUMENTS

| | | |
|---|---|---|
| DE | 8603867 U1 | 3/1989 |
| DE | 3884329 T2 | 2/1994 |
| DE | 4336711 A1 | 5/1994 |
| DE | 19604862 A1 | 8/1996 |
| DE | 10006922 A1 | 9/2000 |
| DE | 10037145 C2 | 3/2001 |
| DE | 202004018618 U1 | 5/2005 |
| DE | 69734795 T2 | 7/2006 |
| DE | 102007041406 A1 | 3/2009 |
| DE | 102008027399 A1 | 12/2009 |
| DE | 202011000834 U1 | 11/2011 |
| DE | 102011055920 B3 | 5/2013 |
| EP | 1021939 A2 | 7/2000 |
| GB | 2408856 A | 6/2005 |
| WO | WO 9632761 A1 | 10/1996 |

* cited by examiner

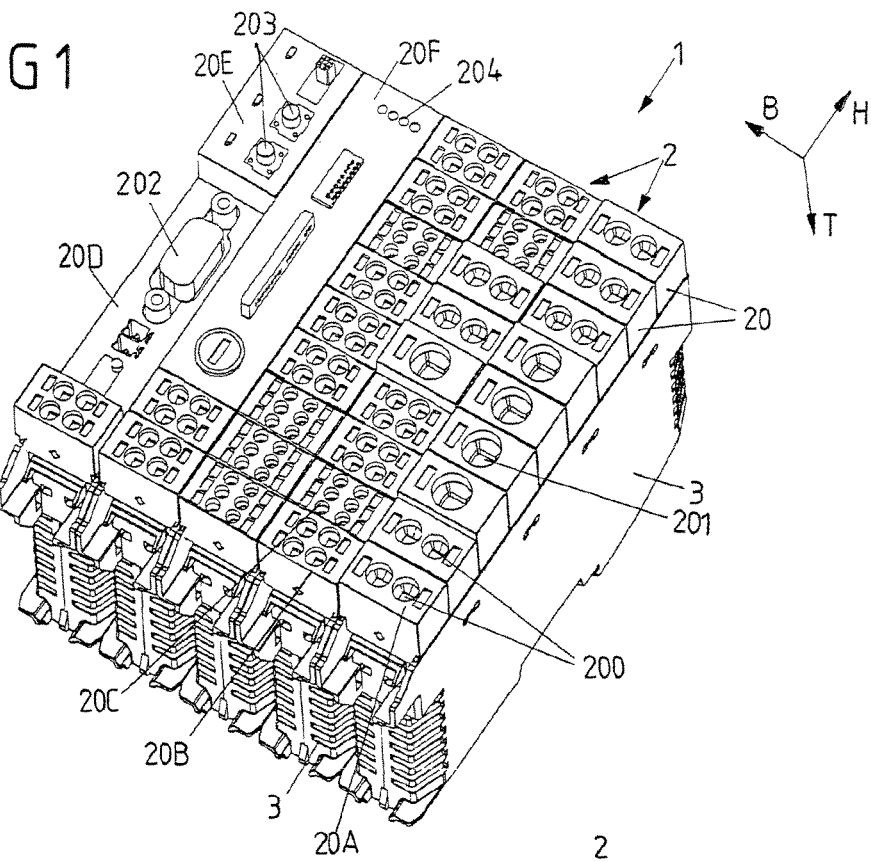
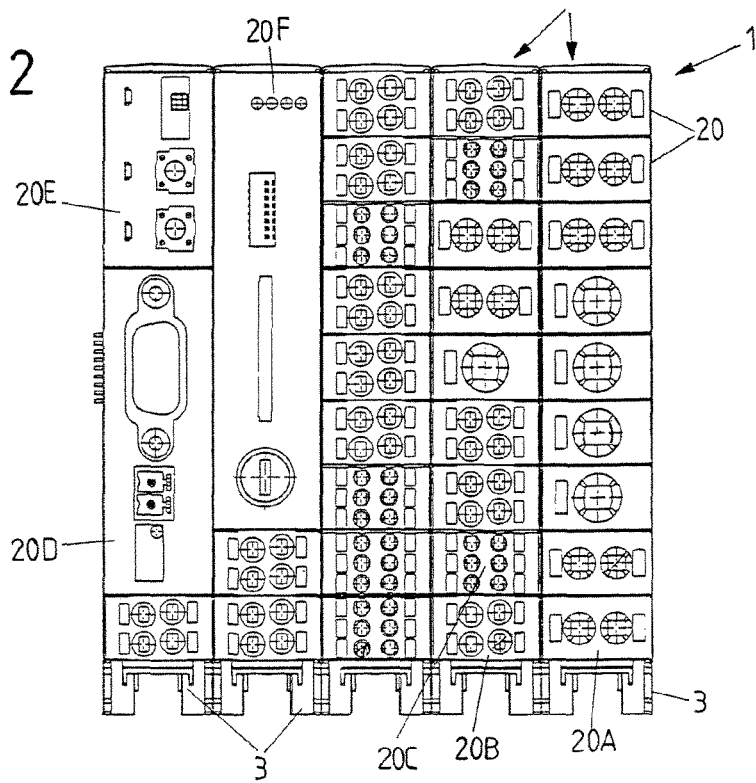

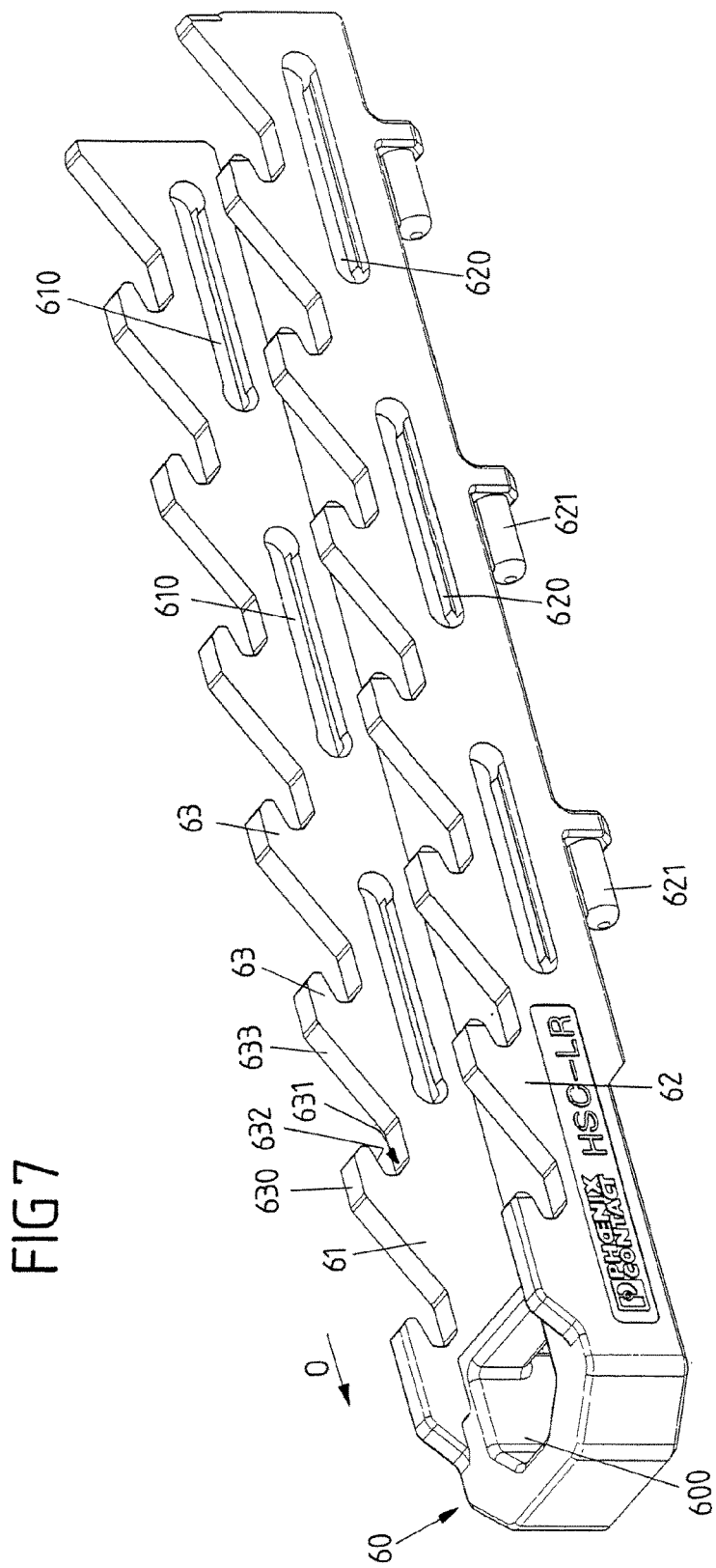

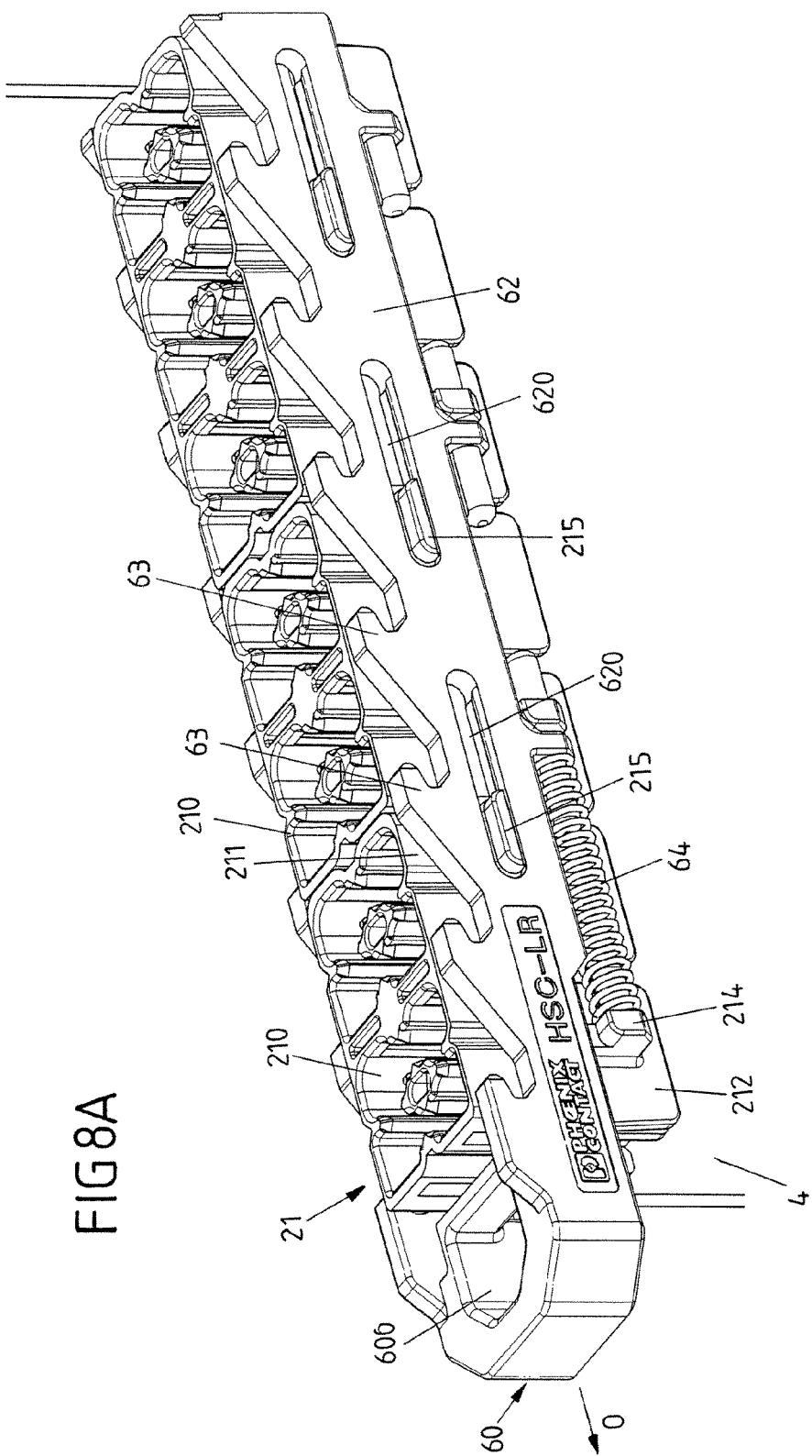

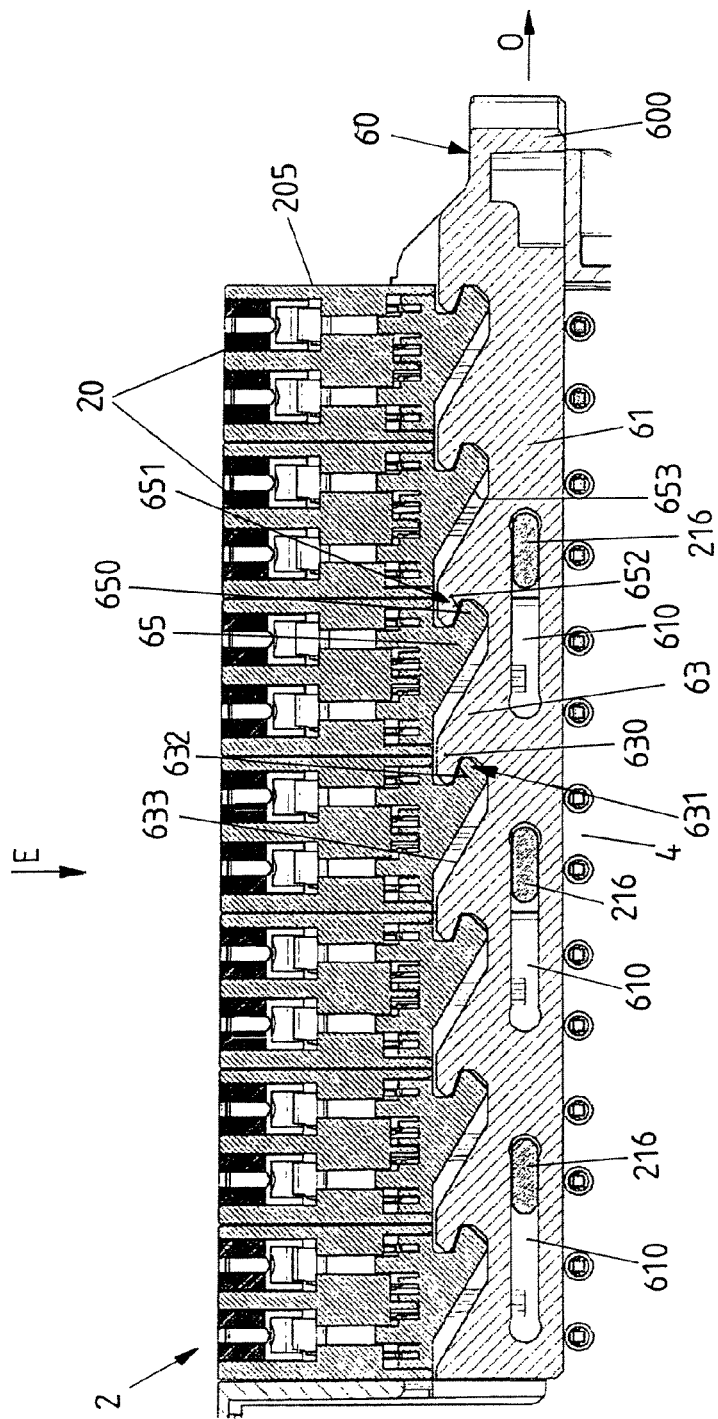

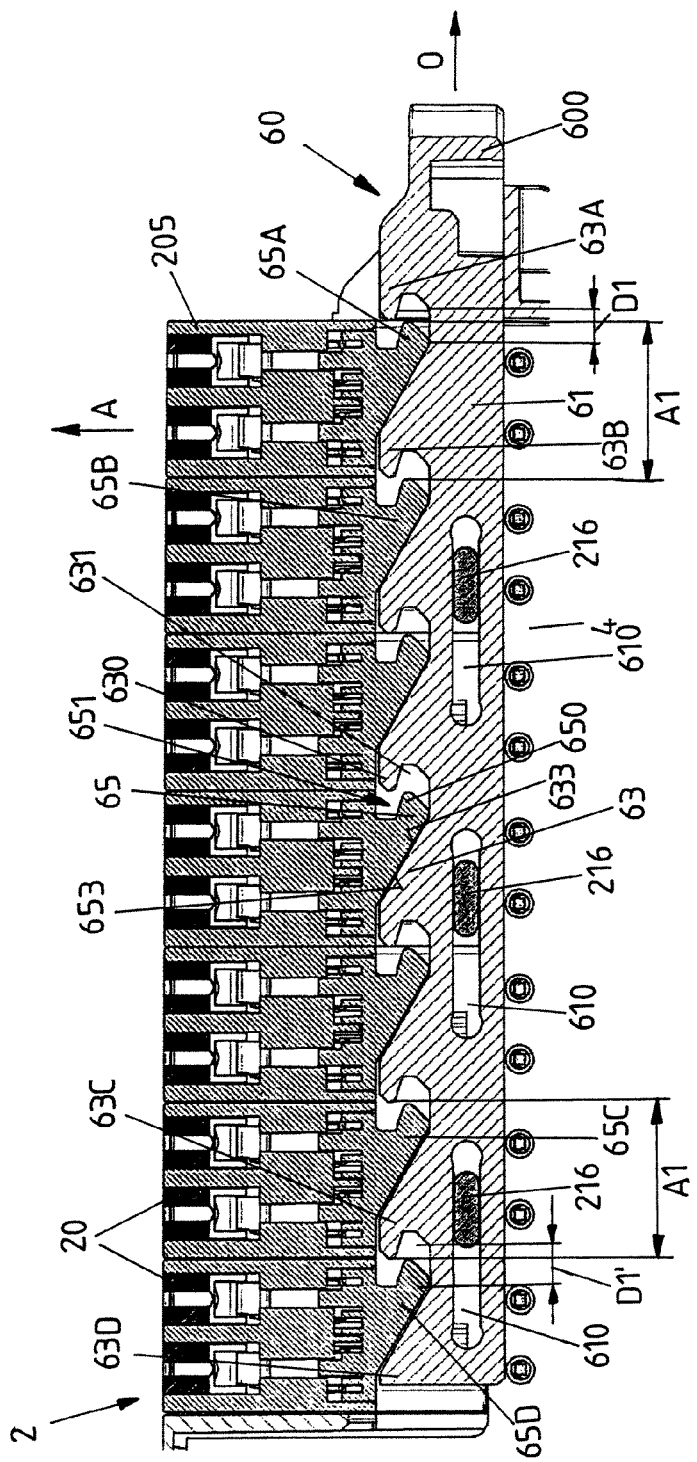

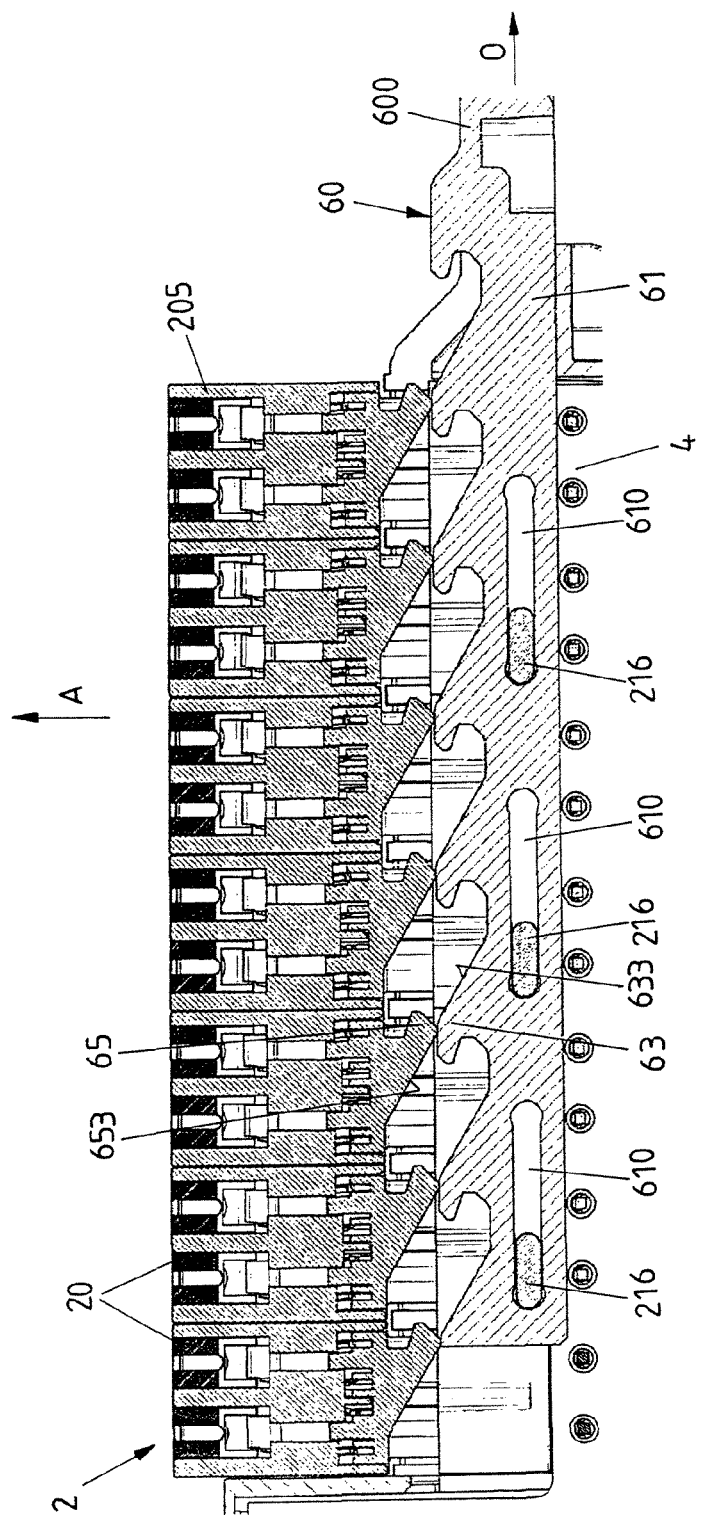

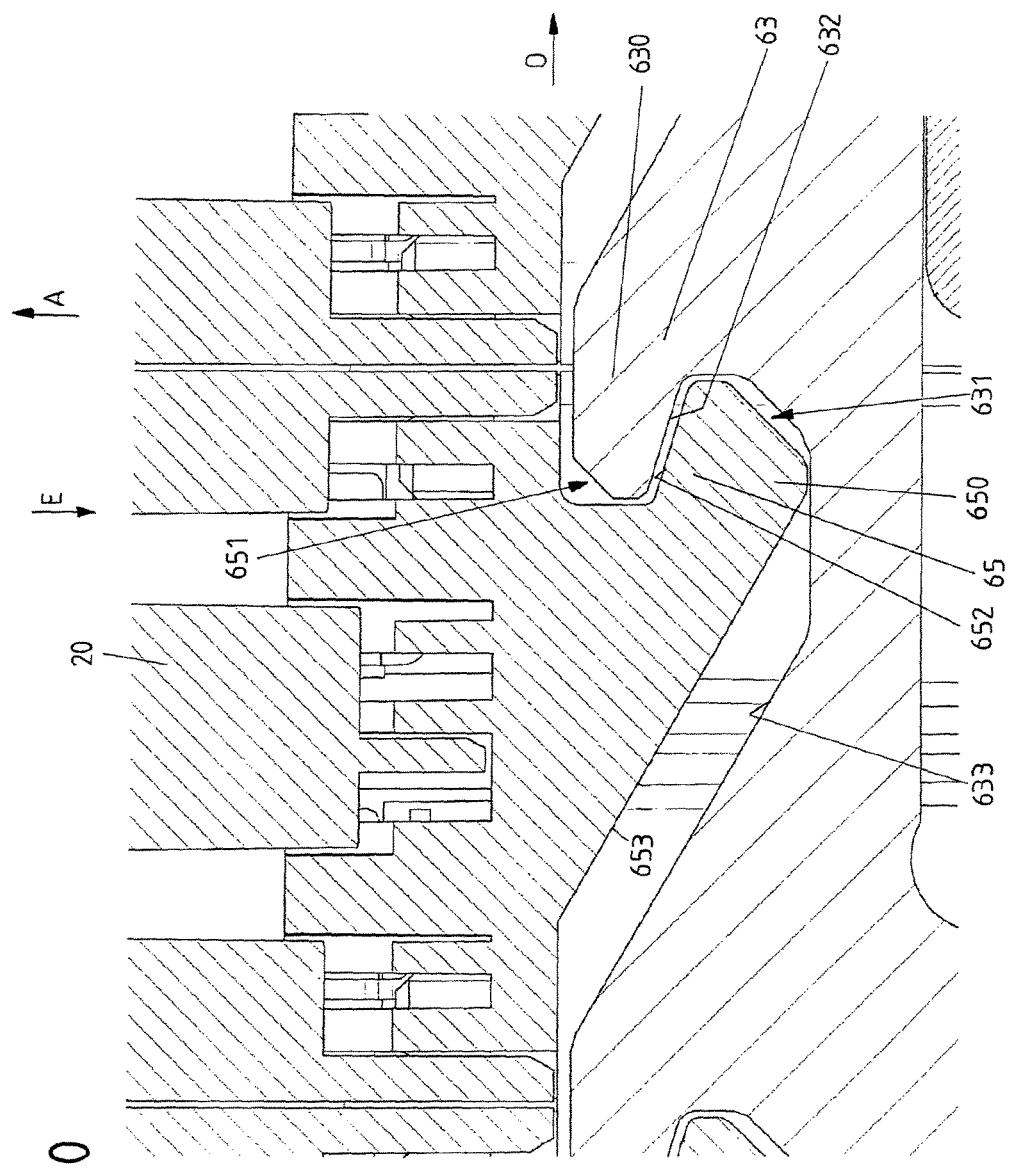

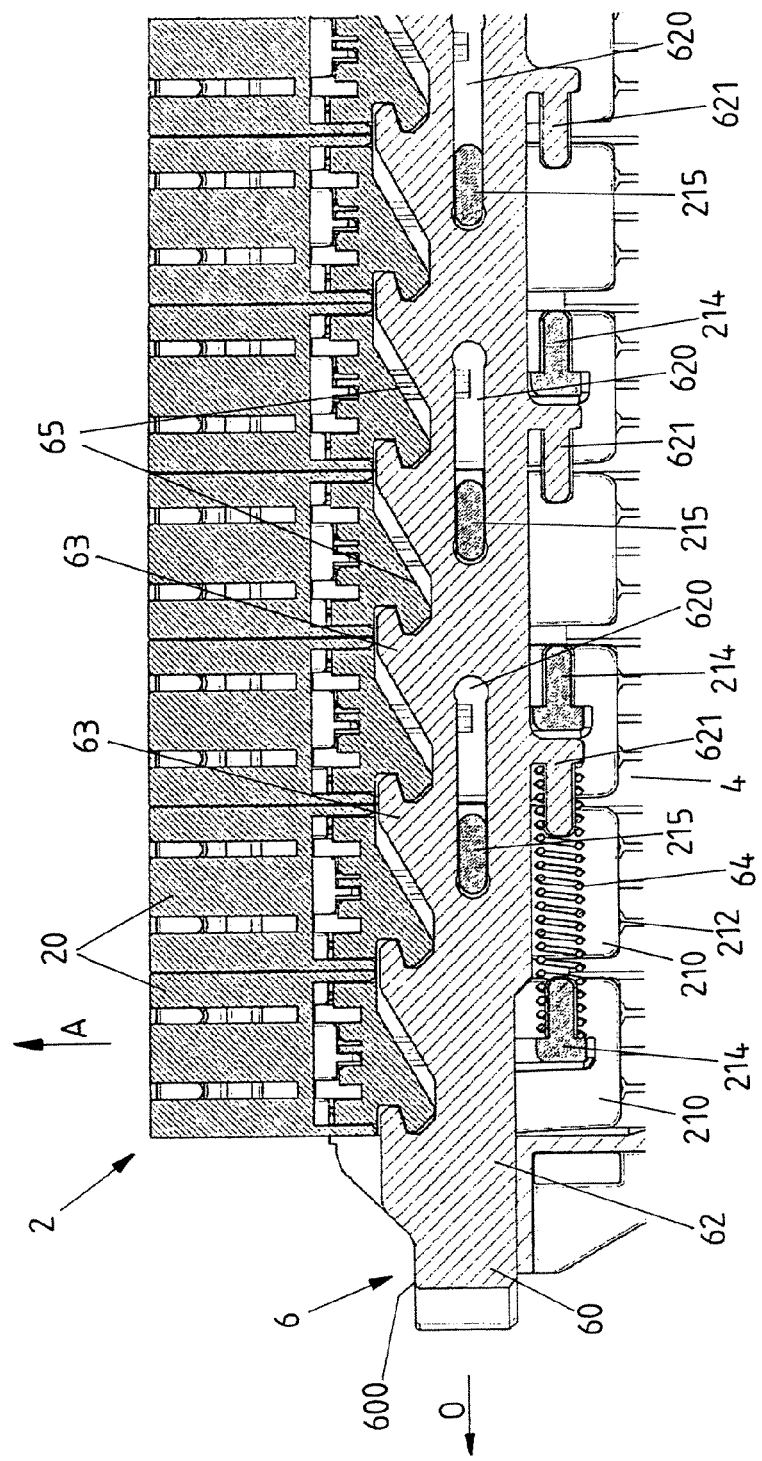

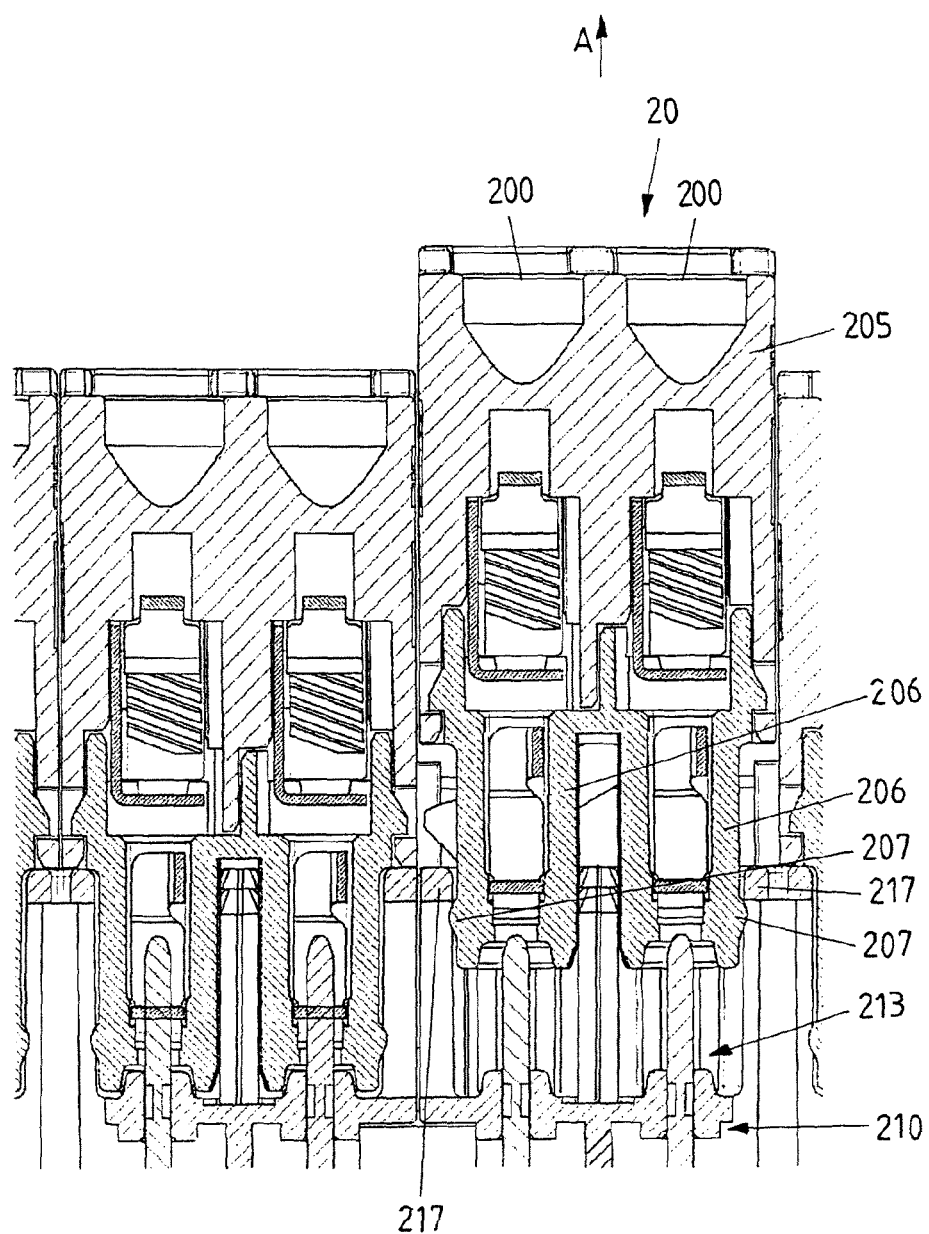

TERMINAL BLOCK FOR AN ELECTRONIC DEVICE

CROSS-REFERENCE TO PRIOR APPLICATIONS

This application is a U.S. National Phase application under 35 U.S.C. § 371 of International Application No. PCT/EP2015/059548, filed on Apr. 30, 2015, and claims benefit to German Patent Application No. DE 10 2014 106 277.9, filed on May 6, 2014. The International Application was published in German on Nov. 12, 2015 as WO 2015/169691 A1 under PCT Article 21(2).

FIELD

The invention relates to a terminal block for an electronic device, which block can be attached to an electronics housing of the electronic device.

BACKGROUND

A terminal block may comprise one or more base strips having a plurality of connector sockets and a plurality of connector modules that can be attached to the connector sockets of the base strip in one or more insertion directions, are held on the connector sockets in an inserted position, and can be released from the connector sockets in order to be removed from the base strip.

Terminal blocks of this kind are conventionally used on modular electronic devices in order to provide a connection technique for example for connecting sensors and actuators to control electronics or the like. Electronic devices of this kind are used for example in industrial facilities, e.g. assembly plants, in conjunction with what are known as field bus systems, and can be plugged onto a carrier bar in a modular manner so as to be arranged in a compact manner, for example in a workshop. For example, sensors from which sensor signals are obtained, and actuators to which control signals are emitted, are connected to the terminal block, it also being possible to additionally provide display elements for displaying system states or the like, or operating elements for inputting a control command or for controlling state variables.

On account of the complexity and variety of the requirements placed on electronic devices, in the case of assembly plants for example, electronic devices of this kind are nowadays developed and manufactured specifically for a particular use. In this case, a specific electronic device contains, in a modular electronics housing, an electronic component in the form of a circuit board that is designed on the basis of the requirements and to which a terminal block, designed in a specific manner, is attached in order to connect single electrical conductors or connectors to the electronic component. Since, in this case, the requirements placed on the terminal block are determined by the electronic component, very different terminal blocks have to be used for different electronic components. This makes the manufacture of such terminal blocks complex and manifold, and thus increases the costs thereof.

Conventionally, it has already been envisaged to provide various connection components, for example connectors or connection terminals, on one terminal block, which components are attached to a cover or the like, in order to form the terminal block. Although this somewhat simplifies the manufacture of such terminal blocks, it requires the manufacture of specific components, for example dedicated covers, in order to produce a particular terminal block.

DE 10 2011 055 920 B3 discloses a control apparatus for automatically controlling a technical facility, in which device a second module part is attached to a first module part. In this case, the first module part receives a circuit board while, for example, connections in the form of spring-type terminals can be attached to the second module part.

DE 38 84 329 T2 discloses a connecting terminal that allows the connection of a plurality of electrical cables having different cross sections.

DE 10 2008 027 399 A1 discloses a connection apparatus in which a plurality of single-pin connection terminal segments are arranged side-by-side and bonded together.

In the terminal block of the type in question here, it is possible for a plurality of connector modules for connecting for example a plurality of sensors, actuators or other elements to an electronic device, to be inserted into a base strip by means of which the terminal block can be connected to an electronic component, for example a circuit board, enclosed in an electronics housing. In the completed state, a plurality of connector modules are inserted into the base strip of the terminal block and connected by means of the base strip to an electronic component enclosed in the electronics housing.

In arrangements of this kind in which connector modules are inserted into the base strip so as to be arranged side-by-side in a row direction for example, and thus held on the base strip in a compact manner, it can be awkward to remove one or more connector modules because a user can only access the connector modules to an inadequate extent, for example. It may therefore be necessary to use special tools in order to separately remove the connector modules, which, however, increases the handling complexity.

There is therefore a need for a terminal block which is simple to handle, in particular in order to remove the connector modules from the base strip, but which at the same time ensures that the connector modules are securely held on the base strip when the connector modules are plugged in.

DE 10 2007 041 406 A1 discloses a locking device and a housing equipped with such a locking device for receiving a plug-in module. The locking device comprises an actuation device for unlocking the plug-in module. A lifting device is connected to the actuation device in order to lift a plug-in module received in the housing while unlocking said module.

SUMMARY

In an embodiment, the present invention provides a terminal block for an electronic device, which block can be attached to an electronics housing of the electronic device, the terminal block comprising: at least one base strip comprising a plurality of connector sockets; a plurality of connector modules configured to be attached to the connector sockets in at least one insertion direction, to be held on the connector sockets in an inserted position, and to be released from the connector sockets to be removed from the at least one base strip; and a locking device. The locking device comprises: an actuating part configured to be moved relative to the at least one base strip in an actuation direction; and a plurality of locking elements that are engaged in a locking manner in mating elements of the connector modules in a locked position such that the connector modules are locked relative to the at least one base strip, counter to the insertion direction. The actuating part is actuable in the actuation direction to remove the connector modules from the at least one base strip such that the locking of the connector modules relative to the at least one base strip is released when in an actuated state.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 1 is a view of various electronic devices that are to be attached to a common carrier bar, each device comprising an electronics housing and a terminal block attached to the electronics housing;

FIG. 2 shows the arrangement according to FIG. 1 from above;

FIG. 7 shows just an actuating part of the locking device;

FIGS. 8A and 8B are views of the actuating part of the locking device on the base strip of an electronic device;

FIG. 9A is a cross section along the line I-I according to FIG. 5, with the actuating part of the locking device in a locked position;

FIG. 9B is the view according to FIG. 9A, but during actuation of the actuating part in order to unlock the connector modules from the base strip;

FIG. 9C is the view according to FIG. 9A, but showing the actuating part in an unlocked position in which the connector modules are unlocked from the base strip;

FIG. 10 is an enlarged view of a locking element of the actuating part when engaged in a mating element of a connector module;

FIG. 11 is a cross section along the line II-II according to FIG. 5; and

FIG. 12 is a cross section of a detail along the line according to FIG. 5 showing an ejection prevention means for preventing a connector module from falling out following an ejection by means of actuation of the actuating part.

DETAILED DESCRIPTION

Figure 3:
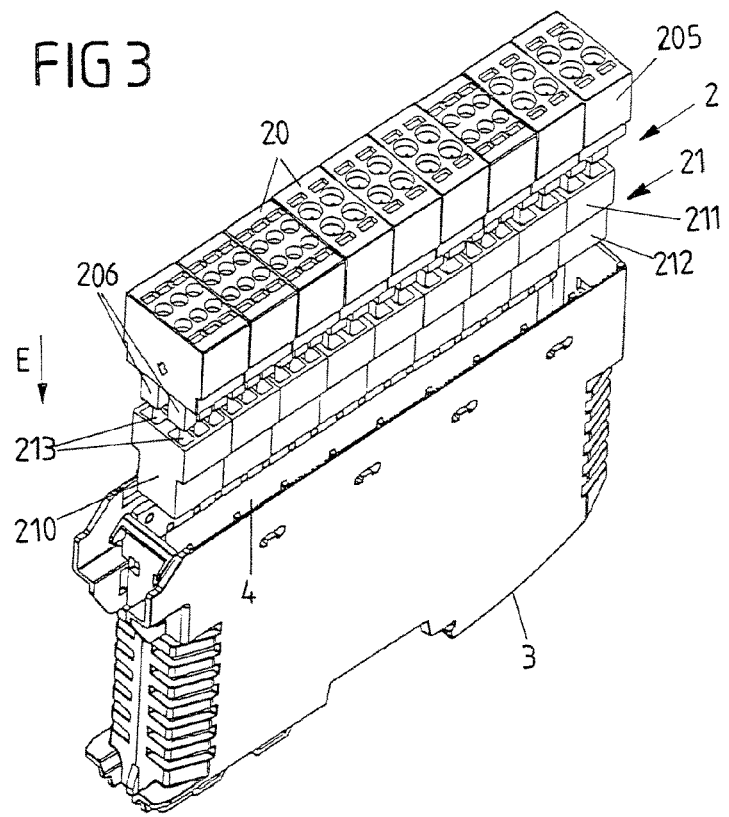
FIG. 3 is a view of an electronic device comprising an electronics housing and a terminal block to be attached to the electronics housing, which terminal block is composed of individual basic housings.

Thus, a locking device comprising an actuating part that can be moved relative to the base strip in an actuation direction is additionally provided, which actuating part comprises a plurality of locking elements that are engaged in a locking manner in mating elements of the connector modules in a locked position such that the connector modules are locked relative to the base strip counter to the insertion direction. The actuating part can be actuated in the actuation direction in order to remove the connector modules from the base strip such that, in an actuated state, the locking of the connector modules relative to the base strip is released.

Accordingly, a locking device is provided that comprises an actuating part that is movably arranged on the base strip or on a housing supporting the base strip or on another part, for example an actuation slide that is arranged on the base strip, the housing or the other part so as to be movable in the actuation direction. When the actuating part is in the locked position, the connector modules are jointly locked to the base strip by means of this single actuating part, with the result that the connector modules cannot easily be removed from the base strip, or at least cannot be inadvertently removed. The actuating part can be actuated by being moved in the actuation direction, and therefore, when the actuating part is actuated, the locking of the connector modules to the base strip is jointly released and the connector modules can thus be removed from the base strip.

When the actuating part is in the unlocked position, the locking of the connector modules to the base strip is released, and a user can thus easily release one or more connector modules from the base strip.

Since a single actuating part of the locking device is provided for jointly locking the connector modules and for jointly unlocking the connector modules, the handling of the terminal block is simplified, in particular for unlocking the connector modules from the base strip. When in the locked position, the connector modules are securely and reliably held on the base strip by means of the actuating part and the locking elements arranged thereon. The locking can be released by actuating the actuating part in the actuation direction, in order to thus release the locking engagement of the locking elements of the actuating part in mating elements of the connector modules.

The locking elements of the actuating part are preferably mutually spaced in the actuation direction. Each connector module comprises, for example, at least one mating element which, in the locking position, is engaged in a locking manner in an associated locking element of the actuating part. The connector modules can be plugged into the base strip so as to be arranged side-by-side for example in the actuation direction, corresponding to a row direction, in which the base strip extends, such that the mating element of one connector module is connected to a locking element of the actuating part, and the mating element of an adjacent connector module is engaged in another locking element of the actuating part that is spaced apart in the actuation direction.

In one embodiment, the actuating part for example comprises two arms that each carry a plurality of locking elements. In this way, the actuating part can be designed in a U shape for example, the arms of the actuating part forming legs of a "U", and the arms being interconnected by means of an actuation portion on which a user can act, for example by means of a suitable tool, in order to actuate the actuating part.

The arms preferably extend in parallel with one another in the actuation direction and are advantageously arranged relative to the base strip such that they extend on either side of the base strip and thus receive the base strip between them. The U-shaped actuating part thus surrounds the base strip and can be moved longitudinally relative to the base strip in the actuation direction.

In this connection it should be noted that the actuating part is preferably designed as an actuating slide that is movably guided longitudinally relative to the base strip. However, this is not essential. It can also be provided for the actuating part to move in a curved actuation direction, and to be formed for example by a pivot part that is to be pivoted for the purpose of actuation.

The actuating part is preferably longitudinally guided on the base strip in the actuation direction by means of the arms, it being possible for the guidance to be provided, for example, by one or more pins engaging in one or more slots. The arms of the actuating part can, for example, each comprise one or more slots that extend in the actuation direction and in which one or more pins of the base strip engage, such that guidance of the arms on the base plate is provided in the manner of a slotted guide. Since the actuating part is guided on the base strip but not on an electronics housing to which the base strip is attached, the actuating part is independent of the housing and the tolerances thereof. The actuating part is in particular supported solely on the base strip, but not on the electronics housing.

The arms of the actuating part preferably each carry a plurality of locking elements. In a specific embodiment, the locking elements of the arms, viewed in a transverse direction transverse to the actuation direction, can be opposite one another in pairs. The arms are spaced apart in the transverse direction. Since the locking elements of the arms are opposite one another in pairs, one locking element of one arm is assigned another locking element of the other arm, which further locking element is in the same axial position when viewed in the actuation direction. A pair of mating elements of a connector module is preferably assigned to this pair of locking elements such that, when in the locked position, the pair of locking elements is engaged in a locking manner in the pair of mating elements of the associated connector module and the connector module is thus held on the base strip in a secure and reliable manner.

Both the locking elements of the actuating part and the mating elements of the connector module are preferably designed to interlock. For this purpose, the locking elements of the actuating part and/or the mating elements of the connector modules can each be formed, for example, in the shape of a hook, comprising a head which, when the actuating part is in the locked position, engages in an associated engagement opening in the other element. If, for example, the locking elements of the actuating part each comprise a head, said head engages in an associated engagement opening in the mating element when the actuating part is in the locked position. If, in contrast, the mating elements of the connector modules each comprise a head, said heads engage in associated engagement openings in an associated locking element of the actuating part when the actuating part is in the locked position. In both cases, interlocking engagement of the locking elements and the mating elements is provided.

It may be advantageous for both the locking elements of the actuating part and the mating elements of the connector modules to each comprise a head. In this case, when the actuating part is in the locked position, the heads of the locking elements engage in engagement openings in the mating elements of the connector modules while, at the same time, the heads of the mating elements of the connector modules engage in associated engagement openings in the locking elements of the actuating part, and another interlocking connection is thus produced.

An unlocking chamfer that extends obliquely to the insertion direction is preferably formed on each head, which chamfer interacts with the other element when force counter to the insertion direction is applied to an associated connector module not by the actuating part, and generates a force on the actuating part in the actuation direction. An unlocking chamfer of this kind makes it possible to release the locking without actuating the actuating part when acting on the connector module in order to release the connector module from the base strip. The unlocking chamfer is arranged obliquely to the insertion direction and is inclined obliquely such that the engagement of the head in the associated engagement opening is not self-locking, and therefore the head can automatically slide out of the associated engagement opening when a connector module is pulled counter to the insertion direction. This makes it possible to remove the connector module from the base strip in a non-destructive manner, for example by manually pulling a connector module, without the actuating part having to be specially actuated for this purpose.

If the head is formed on the locking element of the actuating part, for example, the unlocking chamfer of the head strikes the mating element when the connector module is pulled, and generates a force on the actuating part in the actuation direction, and therefore the actuating part automatically moves and the locking is thus released.

In this case it can preferably be provided for insertion chamfers to be provided on both the heads of the locking elements and the heads of the mating elements, which chamfers strike one another when a connector module is pulled and thus bring about unlocking.

When in the locked position, the actuating part can lock the connector modules relative to the base strip, and can also permit joint actuation in order to unlock the connector modules from the base strip. It can be also provided for the ejection of the connector modules from the base plate counter to the insertion direction to be assisted when the actuating part is actuated, by a suitable ejection device being provided on the actuating part or on the connector modules.

For example, the locking elements of the actuating part and/or the mating elements of the connector modules can each comprise an ejection chamfer that extends obliquely to the insertion direction and which the other element strikes when the actuating part is actuated in the actuation direction, with the result that an ejection force counter to the insertion direction is generated on the connector modules. An ejection chamfer of this kind can be provided on the locking elements of the actuating part, for example. When the actuating part is actuated in the actuation direction, the mating elements of the individual connector modules strike the associated ejection chamfers of the locking elements, such that when the actuating part is actuated the connector modules are automatically lifted out of the connector sockets of the base strip, counter to the insertion direction. Alternatively or in addition, ejection chamfers can also be formed on the mating elements of the connector modules. If ejection chamfers are formed on both the locking elements of the actuating part and the mating elements of the connector modules, the ejection chamfers thus strike one another when the actuating part is actuated, and thus cause the connector modules to be ejected counter to the insertion direction.

The ejection chamfers are preferably arranged and formed on the locking elements and/or on the mating elements such that, when the actuating part is actuated in the actuation direction, the locking is first released and an ejection force is not generated on the connector modules counter to the insertion direction until the locking has been released. The ejection of the connector modules is thus begun only after the locking has been released, and so the ejection of the connector modules is not impeded by possible engagement of the locking elements in the mating elements.

In order to eject the connector modules from the base strip, plug-in portions of the connector modules must be pushed out of the connector sockets of the base strip. Since a not inconsiderable amount of friction may occur between the plug-in portions and the connector sockets, the ejection of a connector module may require a not insignificant amount of force. If all the connector modules are ejected at the same time when the actuating part is actuated, the forces required for ejecting the individual connector modules are added to one another, and therefore the actuation of the actuating part can require a significant amount of force.

In order to reduce the maximum force required for actuating the actuating part, the ejection chamfers are advantageously arranged relative to one another on the locking elements and/or on the mating elements such that the connector modules are not ejected simultaneously, but rather in a manner staggered over time. For this purpose, at least some of the ejection chamfers preferably come into contact with the associated other elements at different times when the actuating part is actuated in the actuation direction, such that the ejecting process of the individual connector modules is initiated in a manner staggered over time.

For example, first of all ejection chamfers of one locking element pair can come into contact with ejection chamfers of a mating element pair of a connector module and strike one another in order to eject the connector module. Only then do ejection chamfers of another locking element pair come into contact with ejection chamfers of a mating element pair of another connector module, and therefore the other connector module is only ejected subsequently, in a manner staggered over time. In this way, the ejection of all the connector modules can be started one after the other, in a manner staggered over time.

Since the ejection of the connector modules is started in a manner staggered over time, the breakaway force, i.e. overcoming the static friction, can be staggered for the individual connector modules, as a result of which the maximum force required for ejecting the connector modules can be significantly reduced.

For this purpose, the ejection chamfers of the locking elements of the actuating part can be spaced apart in the actuation direction for example, the spacings between ejection chamfers that are adjacent in the actuation direction differing. For example, the spacing between the locking elements can continuously increase in the actuation direction.

The actuating part is preferably spring-loaded towards its locked position, relative to the base strip. For this purpose, a spring supported on the base strip can act on an arm of the actuating part, for example. The spring can be formed as a compression spring, for example, and can be tensioned when the actuating part is actuated in the actuation direction, with the result that, once the actuation has ended, the actuating part is automatically restored towards the locked position by the spring force.

The connector modules preferably each comprise at least one plug-in portion for insertion into a plug socket of the base strip. In this case, in an advantageous embodiment, an ejection prevention means is provided on the plug-in portion and prevents the connector module from falling out of the associated connector socket of the base strip during ejection by actuation of the actuating part. For this purpose, the ejection prevention means can, for example, interact with a securing portion of the connector socket when the actuating part is actuated in order to eject the connector module, such that the connector module cannot easily fall out of the associated connector socket but rather is secured in the connector socket.

The ejection prevention means on the plug-in portion can be formed, for example, by a projection which a user cannot easily move past the securing portion of the connector socket, at least not without pulling the connector module, in order to remove the connector module from the base strip. The projection can, for example, be rounded in the manner of a knob, and therefore a user can pull the connector module out of the connector socket without significant force, but said module cannot readily fall out without additional force being applied.

The base strip preferably extends in a row direction. In the inserted position, the connector modules are arranged side-by-side in the row direction and inserted into associated connector sockets of the base strips so as to result in an arrangement of connector modules that are adjacently to one another in the longitudinal direction. In this case, the base strip can for example be composed of a plurality of base strip modules which, in order to form the base strips, are attached side-by-side in the row direction and are rigidly interconnected, for example by bonding, welding or by means of suitable interlocking elements.

In this case, it can be provided for precisely one connector module to be able to be plugged into each base strip module. However, it is also conceivable and possible for a plurality of connector modules to be able to be plugged into one base strip module for example, or for one connector module to be plugged into a plurality of base strip modules.

The base strip produces a connection to an electronic component that is enclosed in the electronics housing. For this purpose, the base strip can be connected to the electronic component, it being possible for a predetermined number of single electrical conductors or connectors to be connected to the connector modules for example. For this purpose, the connector modules can, for example, comprise contact sockets for plugging in single conductors, it being possible for each connector module to comprise a plurality of contact sockets for plugging in a plurality of single conductors.

An electronics housing preferably comprises a terminal block of the type described above, the terminal block being attached to the electronics housing in the insertion direction.

An electronic device comprises an electronics housing of this kind, in which it encloses an electronic component, for example a circuit board. The base strip is connected to the electronic component for example by the base strip being plugged into the circuit board and brought into electrical contact with conductor tracks of the circuit board by means of suitable soldered connections or the like.

FIGS. 1 and 2 show a connection apparatus 1 that is formed in a modular manner in each case by an electronics housing 3 and a terminal block 2, and an electronic component in the form of a circuit board that is received in the electronics housing 3. The electronics housings 3 of the electronic devices are arranged side-by-side in a width direction B and can be attached to a common carrier bar in a manner known per se, such that a compact electronic apparatus comprising modular individual electronic devices is produced.

The terminal blocks 2 of each electronics housing 3 extend in a row direction H longitudinally along the associated electronics housings 3. In this case, the terminal blocks 2 are arranged above the electronics housing 3 in a depth direction T and protrude outwards from the electronics housings 3 in the depth direction T.

The terminal blocks 2 provide an interface for connecting single electrical conductors or connectors to the electronic components received in the electronics housings 3. For this purpose, the terminal blocks 2 comprise a plurality of contact sockets 200 in which contacts 201 are arranged and which form, for example, terminal devices for connecting single electrical conductors. In addition, plug-in connector parts 202, adjustment elements 203 or display elements 204 are provided on individual terminal blocks 2. A compatible connector can be connected to a plug-in connector part 202. Control, for example for adjusting a potentiometer, can be carried out using adjustment elements 203 for example. A system state can for example be indicated by means of display elements 204.

The design of the individual terminal blocks 2 depends on the electronic components received in the electronics housings 3. Depending on the function carried out by the electronic components received in the electronics housings 3, different lines or connectors of different external modular units can be able to be connected to the connection parts 2.

For example, connection apparatuses 1 of this kind can be used in industrial plants in which, for example, sensors and actuators are to be connected to superordinate control apparatuses. The control apparatuses are formed by the electronic components received in the electronics housings 3, and receive sensor signals from sensors that are connected via the terminal blocks 2, and emit control signals to actuators that are also connected via the terminal blocks 2.

In the connection apparatus 1, the terminal blocks 2 are each composed of various base strips 21 comprising base strip modules 210 and connector modules 20, 20A-20F attached thereto. In this case, the base strip modules 210 are attached side-by-side in a row direction H so as to form a terminal block 2, and various connector modules 20, 20A-20F are attached to the base strip modules 210. The connector modules 20, 20A-20F comprise, for example, different numbers of contact sockets 200 and contacts 201 arranged thereon. In this case, the connector modules 20, 20A-20F can differ by the number of contact sockets, the size of the contact sockets, the shape of the contact sockets, the number of contacts arranged in the contact sockets, the size or shape of the contacts, the arrangement of the contacts, or similar. In addition, a connector module 20, 20A-20F can also carry out a function other than that of connecting single electrical conductors or connectors, and can be used, for example, as an operating element or a display element.

In the embodiment shown in FIGS. 1 and 2, the connector module 20A comprises, for example, two contact sockets 200 that can be designed in the manner of terminal devices, for example spring terminals, in order to connect two single electrical conductors. In contrast, the connector module 20B comprises four contact sockets 200 that have a smaller diameter than the two contact sockets 200 of the connector module 20A. The connector module 20C in turn comprises six contact sockets 200 that have a smaller diameter than the contact sockets 200 of the connector module 20B and of the connector module 20A. Another connector module 20D comprises a plug-in connector part 202 in the form of a D-sub connector. Yet another connector module 20E forms an operating element having two adjustment elements 203 in the form of control knobs arranged thereon. In addition, a connector module 20F forms a display element comprising a display device in the form of LEDs arranged thereon.

As can be seen from FIGS. 1 and 2, different contact sockets 200 and contacts 201 of different connector modules 20, 20A-20C can be designed differently. Thus, the contact sockets 200 can have different diameters, or contacts 201 of different connector modules 20, 20A-20F can be at different spacings from one another. In this case, contact sockets 200 having a large diameter can be designed to receive single conductors having a large diameter and correspondingly a high current load capacity, while small contact sockets 200 are used for receiving lines having a small diameter and correspondingly a low current load capacity.

Figure 4:
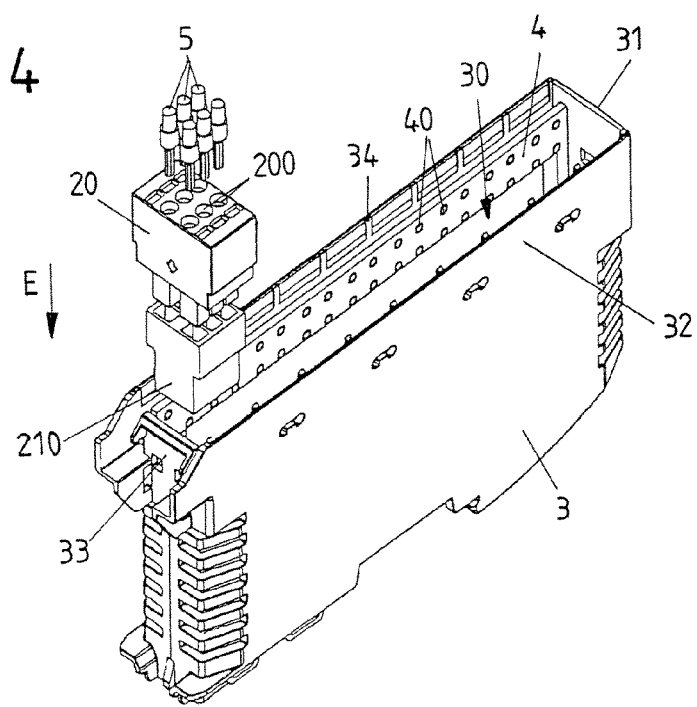
FIG. 4 is a view of the arrangement according to FIG. 3, but showing just one basic housing of the terminal block.

FIGS. 3 and 4 show an electronics housing 3 comprising an electronic component 4 arranged thereon in the form of a circuit board which comprises contact openings 40 for connecting base strip modules 210 of the base strip 21 of an associated terminal block 2. The electronics housing 3 is formed of two side walls 32, 34 that are interconnected by front walls 31, 33 and form a box for enclosing the electronic component 4 in the form of the circuit board.

For the assembly thereof, a base strip 21 is firstly composed of a combination of base strip modules 210 and connected to the electronic component 4, in the form of the circuit board, via the contact openings 40. The base strip 21 can then be inserted, together with the electronic component 4, into an insertion opening 30 in the electronics housing 3 in an insertion direction E, which corresponds to the depth direction T, such that the electronic component 4 and the base strip 21 formed of the base strip modules 210 come to rest in the inside of the electronics housing 3. Associated connector modules 20 can then be inserted into the individual base strip modules 210 in the insertion direction E, such that the electronic device is completed when in the inserted state and, in this embodiment, single electrical conductors 5 can be connected to the terminal block 2.

Figure 5:
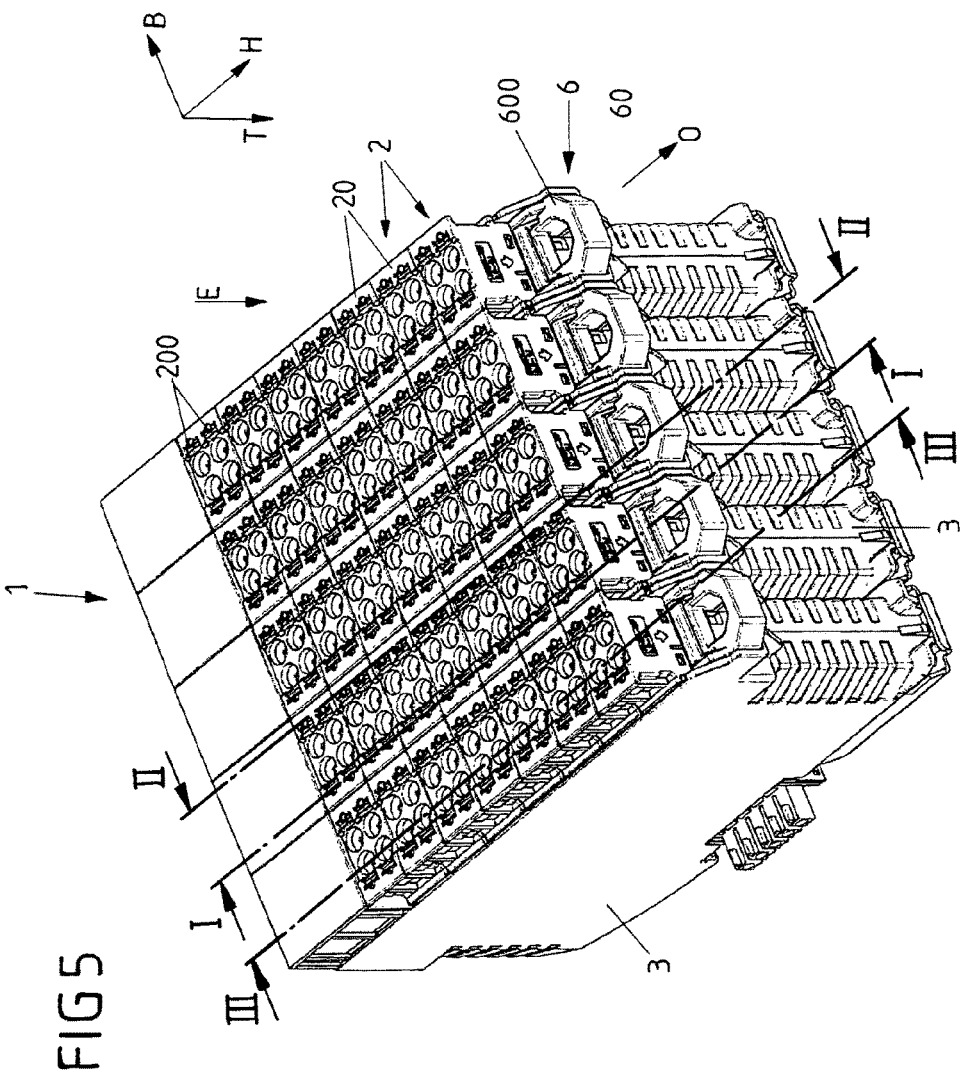
FIG. 5 is a view of another embodiment of various electronic devices that are to be attached to a common carrier bar, each device comprising an electronics housing and a terminal block attached to the electronics housing and a locking device for locking connector modules to a base strip.

FIG. 5 is a perspective view of an embodiment of a connection apparatus 1 comprising a plurality of electronics housings 3 and terminal blocks 2 attached thereto. In principle, the connection apparatus 1 functions in an identical manner to that described above with reference to FIGS. 1 to 4, and comprises terminal blocks 2 that each comprise a plurality of connector modules 20 that are attached to base strips 21 formed of base strip modules 210 and are held on the base strips 21 in an inserted state, as shown in FIG. 5.

The connection apparatus 1 according to FIG. 5 additionally comprises a locking device 6 that comprises an actuating part 60 in the form of an actuation slide that can be moved longitudinally in an actuation direction O and is used to lock the connector modules 20 to the base strip 21 in a locked position such that the connector modules 20 cannot be easily removed from the base strip 21, or at least cannot be inadvertently removed.

Figure 6:
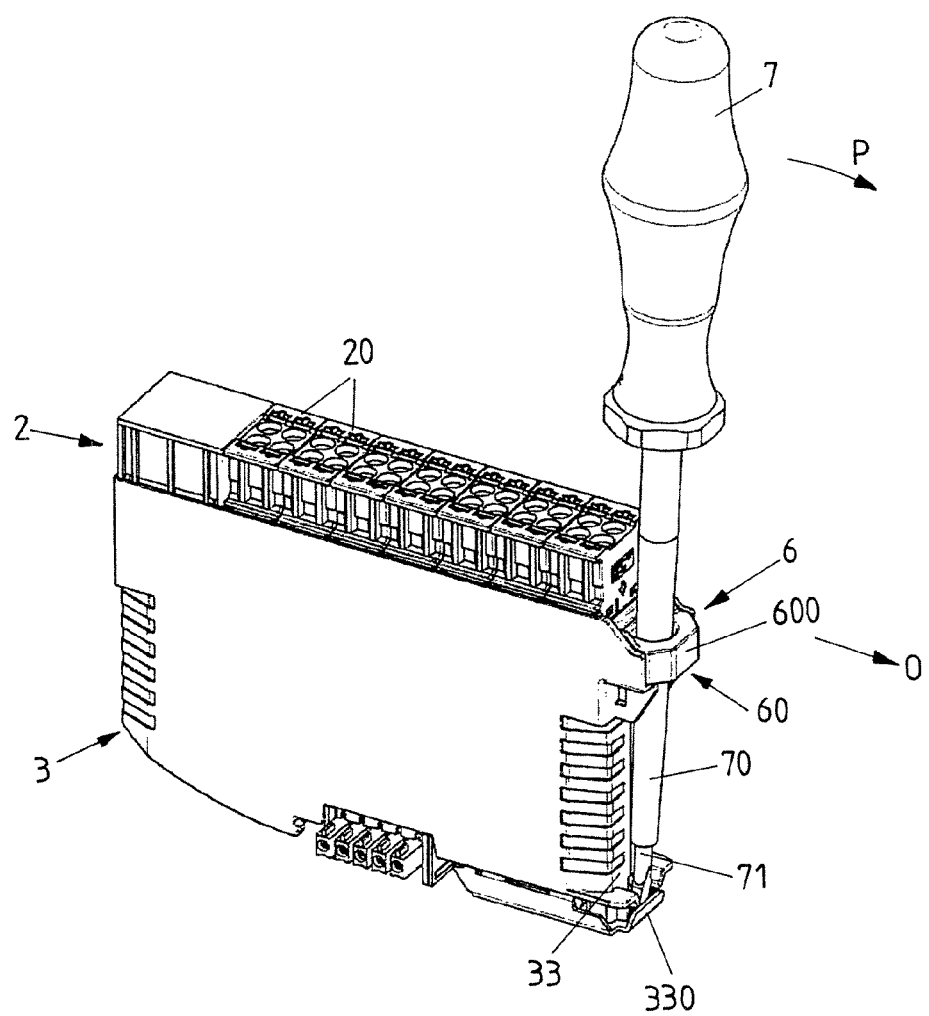
FIG. 6 is a view of an electronic device when the unlocking device is actuated in order to unlock the connector modules from the base strip.

The actuating part 60 is guided longitudinally on an associated base strip 21 of a terminal block 2 in the actuation direction O. The actuating part 60 can be actuated in the actuation direction O by using a tool 7 (as shown in FIG. 6) by placing the tool 7, for example a screwdriver, in an actuation portion 600 of the actuating part 60 by means of a tool shank 70 and inserting a shank tip 71 into an engagement opening 330 in the end face 33 of the electronics housing 3 such that the actuating part 60 can moved in the actuation direction O by tilting the tool 7 in the direction of the arrow P.

Figure 8B:
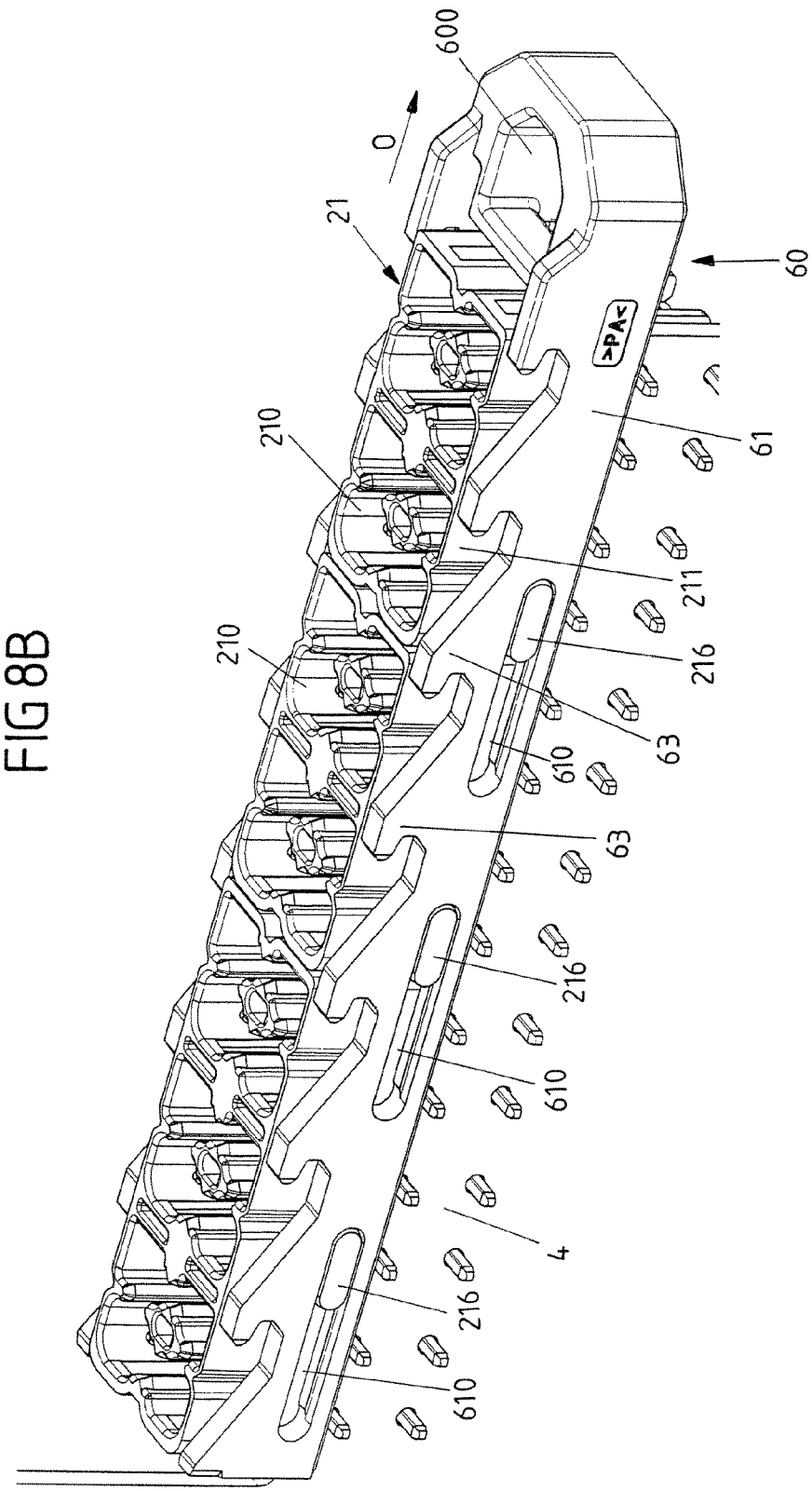

As can be seen from the views according to FIGS. 7, 8A and 8B, the actuating part 60 is manufactured, for example, as a plastics moulded part and is U-shaped. The actuating part 60 thus comprises two arms 61, 62 that adjoin the actuation portion 600 and are interconnected by the actuation portion 600. The arms 61, 62 extend in parallel with one another longitudinally in the actuation direction O and each carry a plurality of locking elements 63 in the form of locking hooks that are arranged on the arms 61, 62 so as to be mutually spaced apart in the actuation direction O.

In this case, the locking elements 63 are arranged on the arms 61, 62 of the actuating part 60 such that the locking elements 63 are opposite one another in pairs in a transverse direction transverse to the actuation direction O. Thus, a locking element 63 of one arm 61 is associated with a locking element 63 of the other arm 62, which, when viewed in the actuation direction O, is arranged axially in the same position on the other arm 62.

The actuating part 60 is movably guided longitudinally on the associated base strip 21 of the terminal block 2 in the actuation direction O by means of the arms 61, 62. For this purpose, a plurality of slots 610, 620 that are mutually spaced in the actuation direction O are formed on each arm 61, 62 of the actuating part 60, in which slots pins 215, 216 arranged on the heads 211 of the base strip modules 210 of the base strip 21 engage and thereby provide longitudinal guidance in the form of a slotted guide.

At the same time, the adjustment path of the actuating part 60 in the actuation direction O is also set by the length of the slots 610, 620 in the actuation direction O. When in a locked position, the pins 215, 216 of the base strip 21 are positioned at a front end of the slots 610, 620 that faces the actuation portion 600, as shown in FIGS. 8A and 8B. For unlocking, the actuating part 60 is slid in the actuation direction O such that the pins 215, 216 move in the associated slots 610, 620 and are thus slid to the other end of the slots 610, 620.

As can be seen from FIGS. 8A and 8B, the base strip modules 210 of the base strip 21 are arranged between the arms 61, 62 of the actuating part 60 in such a way that the base strips 21 are received between the arms 61, 62. The actuating part 60 is guided on both sides of the base strip 21 by means of the arms 61, 62.

The actuating part 60 is spring-loaded relative to the base strip 21 by one of the arms 61, 62, specifically the arm 62, acting on a spring element 64 in the form of a compression spring. The spring element 64 is supported on an extension pin 214 on the base 212 of a base strip module 210 at one end, and on an extension pin 621 of the arm 62 of the actuating part 60 at the other end. If the actuating part 60 is actuated in the actuation direction O, the spring element 64 is tensioned such that, following actuation, the actuating element 60 is automatically restored and moved back towards its initial position.

The locking elements 63 on the arms 61, 62 of the actuating part 60 form pairs of locking elements 63 that are offset from one another in the actuation direction O and that, as can be seen from FIGS. 9A and 11, engage in associated pairs of mating elements 65 of the connector modules 20 when the actuating part is in the locked position 60 and when the connector modules 20 are plugged in.

In this respect, FIG. 9A is a cross section along the line I-I, showing the arm 61 of the actuating part 60 and the locking elements 63 thereof that are engaged in associated mating elements 65 of the connector modules 20. FIG. 11, in contrast, is a cross section along the line II-II from the opposite viewing direction, showing the arm 62 of the actuating part 60 and locking elements 63 arranged thereon engaged in associated other mating elements 65 of the connector modules 20. As can be seen from FIGS. 9A and 11, in the embodiment shown, one pair of mating element 65 of a connector module 20 is assigned to each pair of locking elements 63. When the actuating part is in the locked position 60, corresponding to the position according to FIGS. 9A and 11, the locking elements 63 of the actuating part 60 are interlocked in the mating elements 65 of the connector modules 20 such that the connector modules 20 are held on the base strip 21 counter to the insertion direction E in which the connector modules 20 are attached to the base strip 21.

As can be seen from FIG. 7 in conjunction with FIGS. 9A and 11, the locking elements 63 on the arms 61, 62 of the actuating part 60 and the mating elements 65 of the connector modules 20 each comprise a head 630, 650 which, when in the locked position, engages in an associated engagement opening 631, 651 in the other element 65, 63 such that an interlocking connection is produced between the connector modules 20 and the actuating part 60 when in the locked position. The hook-shaped locking elements 63 are thus interlocked in the likewise hook-shaped mating elements 65 such that the connector modules 20 are thereby held on the actuating part 60 counter to the insertion direction E.

As can be seen from the enlarged view according to FIG. 10, which shows a locking element 63 interacting with an associated mating element 65, the heads 630, 650 of the locking element 63 and of the mating element 65 each comprise an unlocking chamfer 632, 652 on a side facing the other head, which chamfers face one another and are in contact with one another when in the locked position. The unlocking chamfers 632, 652 are each inclined relative to the insertion direction E such that the unlocking chamfers 632, 652 strike one another when a connector module 20 is pulled in an ejection direction A counter to the insertion direction E. In this case, the inclination of the unlocking chamfers 632, 652 is not self-locking. When the connector module 20 is manually pulled in the ejection direction A, the unlocking chamfers 632, 652 thus slide along one another, with the result that a force is generated on the actuating part 60 in the actuation direction O, and the locking between the connector modules 20 and the actuating part 60 can thus be released by pulling the connector module 20 in the ejection direction A.

A connector module 20 can thus be released from the base strip 21 by manually pulling in the ejection direction O, the locking in this case being released in an automatic, non-destructive manner by means of the actuating part 60 without needing to specially actuate the actuating part 60 to do so.

An ejection chamfer 633, 653 is arranged on a rear face of each hook-shaped locking element 63 or mating element 65 facing away from the head 630, 650, and causes the connector modules 20 to be ejected from the base strip 21 when the actuating part 60 is actuated.

If, as shown in FIG. 9B, the actuating part 60 is slid in the actuation direction O, the heads 630, 650 of the locking elements 63 and of the mating elements 65 are firstly disengaged from one another, and the locking of the connector modules 20 to the base strip 21 is thus released. Once the locking has been released, the ejection chamfers 633 of the locking elements 63 come into contact with ejection chamfers 653 of the mating elements 65 of the connector modules 20 such that, in the event of further actuation, the ejection chamfers 633, 653 strike one another and thus cause the connector modules 20 to be ejected in the ejection direction A, as shown in FIG. 9C.

In this respect, FIG. 9C shows a state in which the actuating part 60 is extended to a maximum in the actuation direction O, the pins 215, 216 on the base strip 21 coming to rest at the ends of the slots 610, 620 in the arms 61, 62 that are remote from the actuating portion 600. In this maximally extended state, the ejection chamfers 633 of the locking elements 63 have struck the ejection chamfers 653 of the mating elements 65, and so the outsides of the heads 630 of the locking elements 63 are in contact with the heads 650 of the mating elements 65. The connector modules 20 have therefore been moved relative to the actuating part 60 in the ejection direction A and therefore the plug-in portions 206 thereof have been raised at least in part out of the associated connector sockets 213 on the heads 211 of the base strip modules 210.

As can be seen in FIG. 9B, the ejection chamfers 633 of the individual locking elements 63 are not arranged equidistantly apart from one another on the arms 61, 62 of the actuating part 60. Instead, the spacings between the ejection chamfers 633 vary in the actuation direction O such that, when the actuating part 60 is actuated, the ejection chamfers 633 come into contact with the associated ejection chamfers 653 of the mating elements 65 in a manner staggered over time.

In the embodiment described, in the position shown in FIG. 9B, the ejection chamfer 633 of the locking element 63B (on the right-hand side in the view shown) is in contact with the ejection chamfer 653 of the mating element 65A, with the result that the associated connector module 20 begins to be ejected in the actuation direction O when the actuating part 60 is actuated further. In contrast, in this position, the ejection chamfers 633 of the remaining locking elements 63 are not yet in contact with the associated ejection chamfers 653 of the mating elements 65, the spacing between the ejection chamfers 633, 653 increasing counter to the actuation direction O and being greatest for the ejection chamfers 633, 653 shown on the left-hand side in the drawing.

In other words, the distance D1, D1' that the actuating part 60 has to cover before the ejection chamfers 633, 653 make contact with one another is different for the individual locking elements 63. The distance D1 is smaller for the locking element 63B on the right-hand side of the drawing than for the remaining locking elements 63; the distance D1' is greatest for the locking element 63B on the far left-hand side of the drawing.

As a result, when the actuating part 60 is actuated, the ejection chamfers 633 of the locking elements 63 come into contact with the associated ejection chamfers 653 of the mating elements 65 in a manner staggered over time. The force that needs to be applied in order to eject the connector modules 20 can thus be reduced because in particular a breakaway force, i.e. a force for overcoming the adhesion, for the connector modules 20 has to be applied in a manner staggered over time.

In the actuated position of the actuating part 60 shown in FIG. 9C, the connector modules 20 are raised out of the base strip 21, at least in part, in the ejection direction A. In order in this case to prevent the connector modules 20 from being able to fall out of the associated connector sockets 213 of the base strip modules 210 of the base strip 21 in an uncontrolled manner during ejection of the connector modules 20, an ejection prevention means in the form of a knob-like projection 207 is attached in each case to the plug-in portions 206, at the underside of the heads 205 of the connector modules 20, and comes into contact with a securing portion 217 in the form of an edge portion on an associated connector socket 213 of a base strip module 210 when a connector module 20 is moved in the ejection direction A.

In order to remove a connector module 20 from the base strip 21, a user can grip the connector module 20 after the actuating part 60 has been actuated, and can pull said module out of the associated connector socket 213 of the base strip module 210, it being possible for the projections 207 on the plug-in portions 206 of the connector module 20 to be moved past the securing portions 217, in the form of the upper edge portions of the connector sockets 213, with relatively little application of force.

The projections 207 are preferably dimensioned such that a connector module 20 is prevented from falling out and, in particular when the connection apparatus 1 is mounted overhead, a connector module 20 cannot readily fall from the base strip 21 under the influence of gravity when it is unlocked. At the same time, however, the projections 207 that interact with the securing portions 217 are dimensioned such that the force for manually pulling out the connector modules 20 is small and the connector modules 20 can thus be removed from the base strip 21 without significant effort.

The basic concept of the invention is not restricted to the embodiments described above but can also be implemented in completely different embodiments.

In particular, the connector modules do not necessarily have to be of the same design, but rather can also differ from one another, as shown in FIG. 1. In this case, one connector module can also be engaged in a plurality of locking element pairs of the actuating part and can thus be held in a locking manner on the base strip by means of a plurality of locking element pairs.

In principle, the base strip can have any design and is not necessarily formed of a plurality of base strip modules that are separate from one another in a pre-assembly state. A base strip can also be formed integrally as a one-piece strip.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Connection apparatus
2 Terminal block
20, 20A-20F Connector module
200 Contact socket
201 Contact
202 Plug-in connector part 203 Adjustment element
204 Display element
205 Head
206 Plug-in portion
207 Ejection projection
21 Base strip
210 Base strip module
211 Head
212 Base
213 Connector socket
214 Extension pin
215, 216 Guide pin
217 Securing portion
3 Electronics housing
30 Insertion opening
31-34 Wall
330 Engagement opening
4 Electronic component (circuit board)
40 Contact openings
5 Single conductor
6 Locking device
60 Actuating part (actuation slide)
600 Handle
61 Arm
610 Slot
62 Arm
620 Slot
621 Extension pin
63, 63A-63D Locking element
630 Head
631 Engagement opening
632 Unlocking chamfer
633 Ejection chamfer
64 Spring element
65, 65A-65D Mating element
650 Head
651 Engagement opening
652 Unlocking chamfer
653 Ejection chamfer
7 Tool
70 Shank
71 Shank tip
A Ejection direction
A1 Spacing
B Width direction
D1, D1' Spacing
E Insertion direction
H Row direction
O Actuation direction
P Direction
T Depth direction

The invention claimed is:

1. A terminal block for an electronic device, in which the block can be attached to an electronics housing of the electronic device, the terminal block comprising:
at least one base strip comprising a plurality of connector sockets;
a plurality of connector modules configured to be attached to the connector sockets in at least one insertion direction, to be held on the connector sockets in an inserted position, and to be released from the connector sockets to be removed from the at least one base strip; and
a locking device, the locking device comprising:
an actuating part configured to be moved relative to the at least one base strip in an actuation direction; and
a plurality of locking elements that are engaged in a locking manner in mating elements of the connector modules in a locked position such that the connector modules are locked relative to the at least one base strip, counter to the insertion direction,
wherein the actuating part is actuable in the actuation direction to remove the connector modules from the at least one base strip such that the locking of the connector modules relative to the at least one base strip is released when in an actuated state,
wherein at least one of the locking elements of the actuating part or the mating elements of the connector modules each comprise an ejection chamfer that extends obliquely to the insertion direction and which the other element is configured to strike when the actuating part is actuated in the actuation direction, generating an ejection force counter to the insertion direction on the connector modules, and
wherein at least one of the ejection chamfers of the locking elements or of the mating elements are arranged relative to the other elements such that at least some of the ejection chamfers are configured to come into contact with the associated other elements at different times when the actuating part is actuated in the actuation direction.

2. The terminal block according to claim 1, wherein the actuating part comprises an actuation slide that is arranged on the at least one base strip or on a housing so as to be movable in the actuation direction.

3. The terminal block according to claim 1, wherein a plurality of locking elements of the actuating part are mutually spaced in the actuation direction.

4. The terminal block according to claim 1, wherein each connector module comprises at least one mating element which, in the locked position, is engaged in a locking manner in an associated locking element of the actuating part.

5. The terminal block according to claim 1, wherein the actuating part comprises two arms that each comprise a plurality of locking elements.

6. The terminal block according to claim 5, wherein the two arms extend in parallel with one another in the actuation direction.

7. The terminal block according to claim 5, wherein the arms extend on either side of the at least one base strip such that the at least one base strip is arranged between the arms.

8. The terminal block according to claim 5, wherein the arms are longitudinally guided on the at least one base strip in the actuation direction.

9. The terminal block according to claim 5, wherein the locking elements of the arms are opposite one another in pairs when viewed in a transverse direction transverse to the actuation direction in which the arms are mutually spaced.

10. The terminal block according to claim 5, wherein the connector modules each comprise a pair of mating elements which, in the locked state, are engaged in a locking manner in a pair of locking elements of the arms of the actuating part.

11. The terminal block according to claim 1, wherein at least one of the locking elements of the actuating part or the mating elements of the connector modules are in each case formed in the shape of a hook, comprising a head which, when the actuating part is in the locked position, is configured to engage in an associated engagement opening in the other element.

12. The terminal block according to claim 11, wherein the head comprises an unlocking chamfer that extends obliquely to the insertion direction, the chamfer being configured to interact with the other element when force counter to the insertion direction is applied to an associated connector module not by the actuating part, and generates a force on the actuating part in the actuation direction.

13. The terminal block according to claim 1, wherein the locking elements of the actuating part and the mating elements of the connector modules each comprise an ejection chamfer that extends obliquely to the insertion direction, the ejection chamfers of the locking elements and the ejection chamfers of the mating elements being configured to strike one another when the actuating part is actuated in the actuation direction, so as to cause the connector modules to be ejected counter to the insertion direction.

14. The terminal block according to claim 1, wherein the ejection chamfers are arranged and formed on at least one of the locking elements or on the mating elements such that, when the actuating part is actuated in the actuation direction, the locking is first released and an ejection force is not generated on the connector modules counter to the insertion direction until the locking has been released.

15. The terminal block according to claim 1, wherein the ejection chamfers of a plurality of locking elements of the actuating part are mutually spaced in the actuation direction, the spacings between ejection chamfers that are adjacent in the actuation direction differing.

16. The terminal block according to claim 1, wherein the actuating part is spring-loaded towards its locked position, relative to the at least one base strip.

17. The terminal block according to claim 1, wherein the connector modules each comprise at least one plug-in portion for insertion into a connector socket of the at least one base strip, the at least one plug-in portion comprising an ejection projection which interacts with a securing portion of the connector socket when the actuating part is actuated to eject the connector module, and therefore the connector module is prevented from falling out of the connector socket following actuation of the actuating part.

18. The terminal block according to claim 1, wherein the at least one base strip extends in a row direction and, when in the inserted position, the connector modules are arranged side-by-side in the row direction.

19. The terminal block according to claim 18, wherein the at least one base strip comprises a plurality of base strip modules that are attached side-by-side in the row direction in order to form the at least one base strip.

20. The terminal block according to claim 19, wherein at least one connector module is configured to be attached to each base strip module.

21. The terminal block according to claim 1, wherein the at least one base strip is configured to be connected to an electronic component and a predetermined number of single electrical conductors or connectors are configured to be connected to the connector modules.

22. An electronics housing comprising a terminal block according to claim 1, wherein the terminal block is attached to the electronics housing in the at least one insertion direction.

23. An electronic device comprising an electronics housing according to claim 22, wherein an electronic component is arranged in the electronics housing and the at least one base strip is connected to the electronic component.

* * * * *